United States Patent [19]

Colin

[11] Patent Number: 4,716,316
[45] Date of Patent: Dec. 29, 1987

[54] FULL WAVE, SELF-DETECTING DIFFERENTIAL LOGARITHMIC RF AMPLIFIER

[75] Inventor: Dennis P. Colin, Beverly, Mass.

[73] Assignee: Varian Associates, Inc., Palo Alto, Calif.

[21] Appl. No.: 53,604

[22] Filed: May 20, 1987

Related U.S. Application Data

[63] Continuation of Ser. No. 698,204, Feb. 4, 1985, abandoned.

[51] Int. Cl.$^4$ .............................................. G06G 7/24
[52] U.S. Cl. .................................. 307/492; 328/145; 329/192
[58] Field of Search ............................. 307/490–495, 307/260, 261; 328/142–145; 325/152

[56] References Cited

U.S. PATENT DOCUMENTS

| | | | |
|---|---|---|---|
| 3,061,789 | 10/1962 | Mace | 329/101 |
| 3,417,263 | 12/1968 | Thomas | 307/229 |
| 3,573,491 | 4/1971 | Goss et al. | 307/229 |
| 3,605,027 | 9/1971 | Nichols et al. | 328/145 |
| 3,662,274 | 5/1972 | Pritchard et al. | 329/192 |
| 3,668,535 | 6/1972 | Lansdowne | 329/192 |
| 3,678,294 | 7/1972 | Glathe | 307/230 |
| 3,757,136 | 9/1973 | Hughes | 307/229 |
| 3,921,008 | 11/1975 | Claverie | 307/230 |

FOREIGN PATENT DOCUMENTS

| | | |
|---|---|---|
| 865466 | 4/1961 | United Kingdom . |
| 892466 | 3/1962 | United Kingdom . |
| 1005684 | 9/1965 | United Kingdom . |
| 1155763 | 6/1969 | United Kingdom . |

OTHER PUBLICATIONS

Lamagna, "Designing Compact Log Amps", *Microwaves*, Apr. 1974.

*Primary Examiner*—Stanley D. Miller
*Assistant Examiner*—B. P. Davis
*Attorney, Agent, or Firm*—Stanley Z. Cole; Gerald M. Fisher; Terrence E. Dooher

[57] ABSTRACT

A logarithmic rf amplifier includes a plurality of cascaded stages each including a differential amplifier which performs full-wave rectification of the rf signal and a circuit for providing a video signal representative of the full-wave rectified rf signal. The logarithmic amplifier further includes a circuit for supplying rf signals of equal amplitude and opposite polarity to the inputs of the first differential amplifier stage and a circuit for summing the video signals from each of the stages and providing a logarithmic video output. The amplifier exhibits extremely fast pulse response and clean limiting.

4 Claims, 2 Drawing Figures

FULL WAVE, SELF-DETECTING DIFFERENTIAL LOGARITHMIC RF AMPLIFIER

This application is a continuation of application Ser. No. 698,204, filed Feb. 4, 1985 and now abandoned.

BACKGROUND OF THE INVENTION

This invention relates to logarithmic rf amplifiers and, more particularly, to a logarithmic rf amplifier which employs differential amplifiers to provide full-wave detection of the rf signal.

Logarithmic rf amplifiers are frequently used in radar systems for compression of the dynamic range of received signals. The amplitude of a video output signal varies logarithmically with respect to the amplitude of the rf input signal. Logarithmic rf amplifiers usually comprise multiple rf amplification stages with amplitude limiting. The rf signals in each stage are detected and summed to provide a log video output.

A prior art logarithmic rf amplifier is disclosed in U.S. Pat. No. 3,668,535, Landsdowne, issued June 6, 1972. The rf outputs of each amplification stage are detected and applied to video limiters. The outputs of the video limiters are summed in a delay line arrangement. In other prior art log amplifiers, a single-ended amplifier transistor performs half-wave self-detection and the detected voltages are summed. Prior art log rf amplifiers have utilized half-wave detection with a peak holding capacitor.

Prior art log rf amplifiers have provided generally satisfactory performance but have been subject to certain disadvantages. The use of half-wave detection and peak holding capacitors makes the pulse response slow. Filter circuits to remove rf ripple also affect pulse response. In addition, the use of single-ended amplifier stages has often resulted in output transients and unsymmetrical limiting.

In general, the accuracy of a log rf amplifier, or the deviation of the transfer characteristic from an ideal log characteristic, should be less than 1%. In addition, log amplifier circuits are usually required to exhibit very fast pulse response and wide bandwidths. Furthermore, it is desirable for the logarithmic rf amplifier to exhibit symmetrical limiting characteristics while avoiding transients.

It is a general object of the present invention to provide a novel logarithmic rf amplifier.

It is another object of the present invention to provide a logarithmic rf amplifier utilizing differential amplifier stages and full-wave detection.

It is yet another object of the present invention to provide a logarithmic rf amplifier exhibiting extremely fast pulse response.

SUMMARY OF THE INVENTION

According to the present invention, these and other objects and advantages are achieved in a logarithmic rf amplifier comprising a plurality of cascaded amplifier stages, each comprising differential amplifier means including a pair of rf inputs, a pair of rf outputs and means for full-wave rectification of the rf input signal, the rf outputs supplying the rf inputs of the succeeding stage, and first circuit means for providing a video signal representative of the full-wave rectified rf signal. The logarithmic rf amplifier further includes second circuit means for supplying rf signals of equal amplitude and opposite polarity to the inputs of the first amplifier stage and third circuit means for summing the video signals from each of the stages and providing a logarithmic video output.

BRIEF DESCRIPTION OF THE DRAWINGS

For a better understanding of the present invention, together with other and further objects, advantages and capabilities thereof, reference may be had to the accompanying drawings which are incorporated herein by reference and in which.

DETAILED DESCRIPTION OF THE INVENTION

Figure 2:
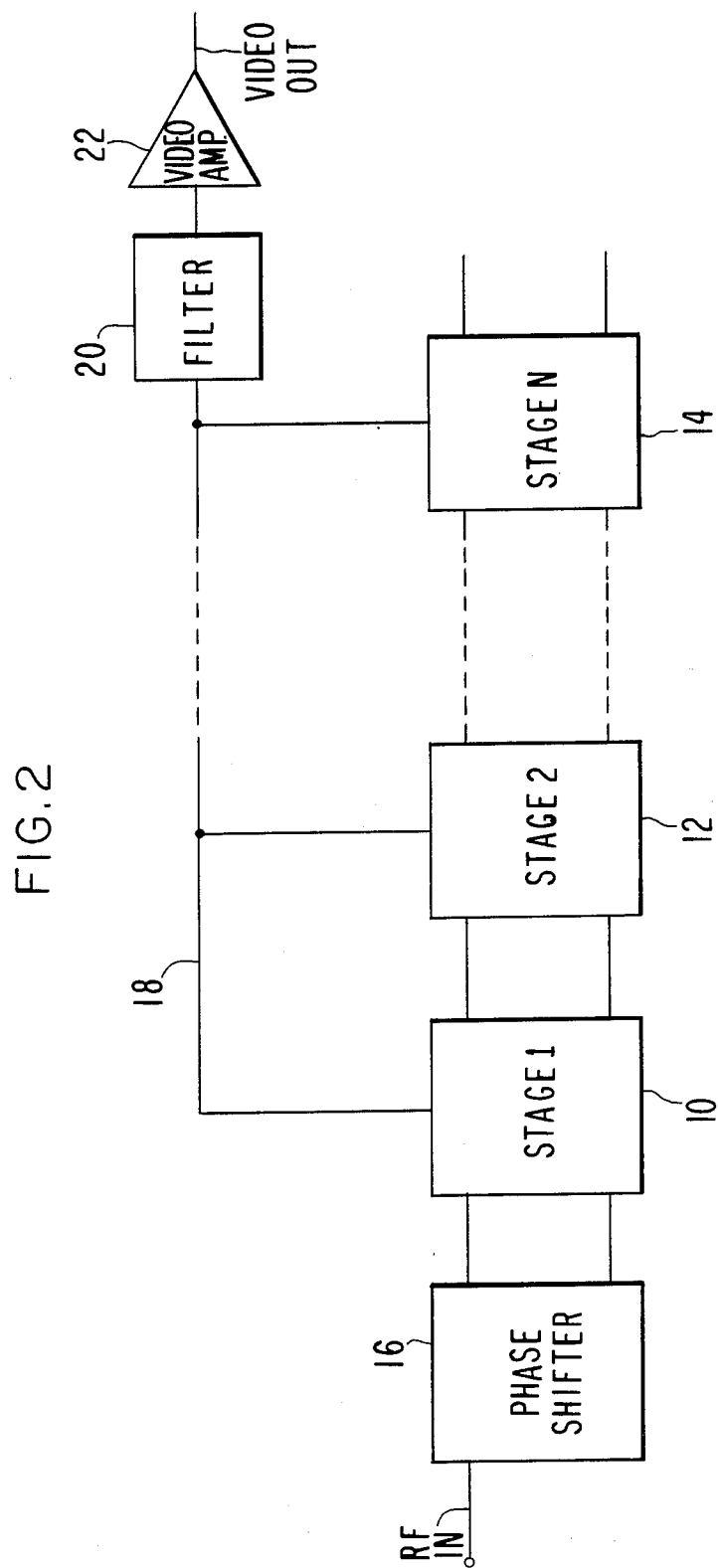
FIG. 2 is a block diagram of a logarithmic rf amplifier in accordance with the present invention.

A logarithmic rf amplifier in accordance with the present invention is shown in block diagram form in FIG. 2. The amplifier includes a plurality of cascaded differential amplifier stages 10, 12, 14. A phase-shifter 16 supplies rf signals of equal amplitude and opposite polarity to the first stage 10. Each of the stages 10, 12, 14 provides a full-wave detected output which is connected to a video summing line 18. The video summing line 18 is coupled through a filter 20 to a video amplifier 22. The output of the video amplifier 22 represents the logarithm of the rf input amplitude. The number of stages is selected to accommodate the dynamic range of the rf input signal.

Figure 1:
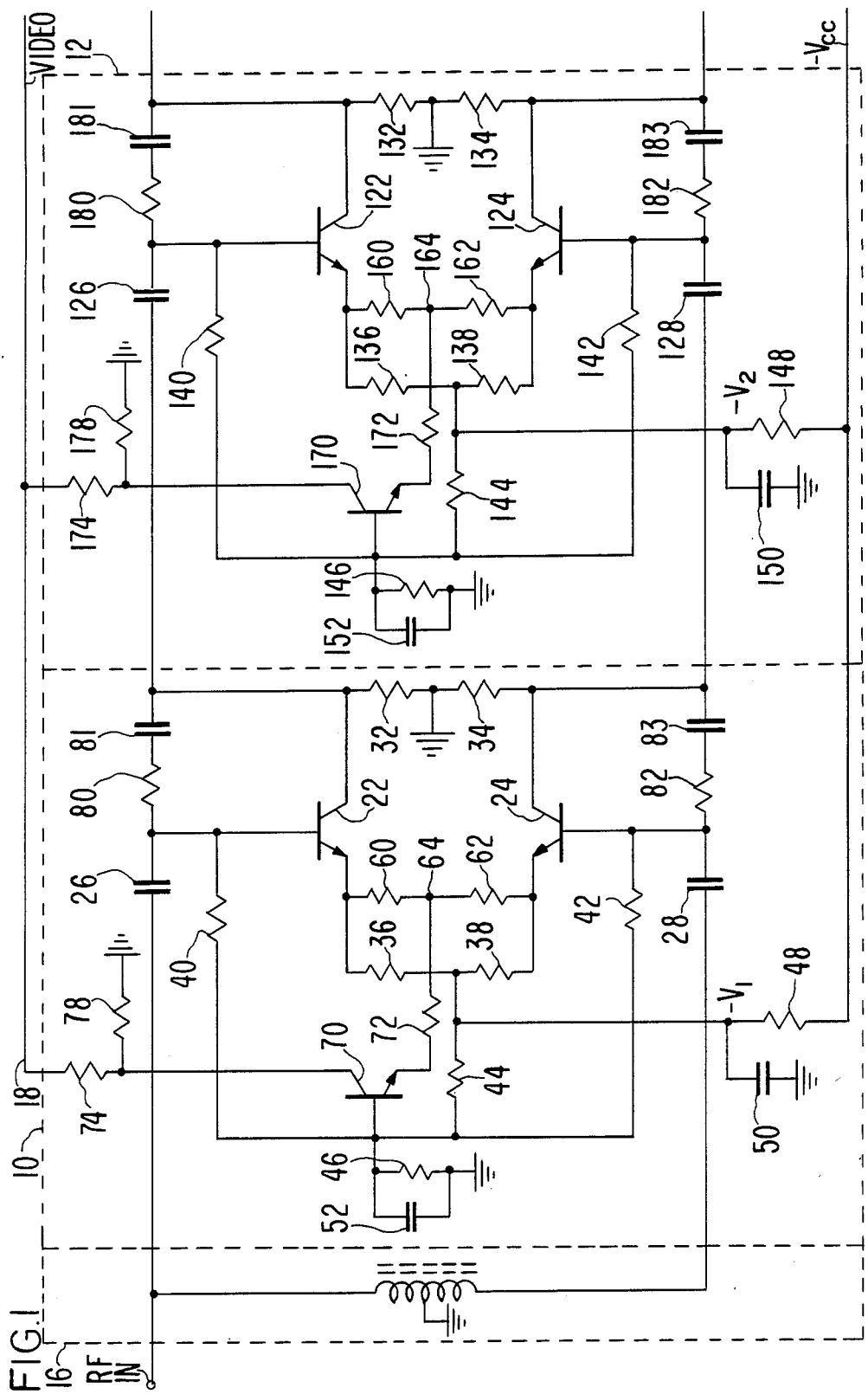
FIG. 1 is a schematic diagram of two stages of a logarithmic rf amplifier in accordance with the present invention.

The first two stages 10, 12 of the logarithmic rf amplifier and the phase-shifter 16 are shown schematically in FIG. 1. The first stage 10 includes a differential amplifier comprising transistors 22, 24. The rf inputs to the stage 10 are supplied to the bases of the transistors 22, 24 through coupling capacitors 26, 28. The rf inputs to the transistors 22, 24 are opposite in phase (phase-shifted by 180°) and equal in amplitude. The phase-shifter 16 comprises a coil with a grounded center tap and opposite ends coupled to the capacitors 26, 28, respectively. Amplified output signals of opposite phase are supplied to the second stage 12 from the collectors of the transistors 22, 24. The transistors 22, 24 are biased in a linear operating region by collector resistors 32, 34; emitter resistors 36, 38; and base resistors 40, 42. The collector resistors 32, 34 are coupled from the collectors of transistors 22, 24, respectively to ground. The emitters of transistors 22, 24 are coupled through resistors 36, 38, respectively, to a filtered supply voltage $-V_1$. The bases of transistors 22, 24 are coupled through resistors 40, 42, respectively, and a resistive divider comprising resistors 44, 46 to the supply voltage $-V$. In the present example, the transistors 22, 24 have a dc collector current of about four milliamps. A series supply resistor 48 and decoupling capacitors 50, 52 are utilized for rf filtering and isolation of the power supply voltage $-V_{cc}$.

When rf signals of opposite phase are supplied to the inputs of the differential amplifier (the bases of transistors 22, 24), the signals are amplified and supplied to the inputs of the next stage. The rf signal also appears at the emitters of the transistors 22, 24 with the same phase as the respective inputs. As the rf signal increases in amplitude, the nonlinear characteristic of the base-emitter junction of the transistors 22, 24 takes effect. During the positive half cycle of the rf signal, each transistor is turned on; and the voltage at the emitter increases. During the negative half cycle of the rf signal, the transistor is turned off. Each of the transistors 22, 24 acts as a half-wave detector.

In order to perform full-wave self-detection of the rf signal, the emitters of the transistors 22, 24 are coupled through small value resistors 60, 62, respectively, to a common point 64. Since the emitters of the transistors 22, 24 detect positive half cycles of opposite phase signals, the point 64 provides a full-wave detected video signal, the average dc value of which increases towards zero as the rf input signal amplitude increases.

The voltage at the common point 64 is sensed and provided as an output of the stage 10 by the transistor 70. The emitter of transistor 70 is coupled through a resistor 72 of small value to the point 64. The base of the transistor 70 is coupled to the junction point of the resistive divider including resistors 44, 46 for biasing. The collector of the transistor 70 is coupled through a collector resistor 74 to the video summing line 18. A log trim resistor 78 is coupled between the collector of the transistor 70 and ground. With no rf signal, the transistor 70 is biased for a nominal collector current, for example, 1.5 milliamps, which passes through the resistors 72, 60, 62, 36, 38 to the supply voltage $-V_1$. As the rf signal is increased in amplitude, the average voltage at the emitters of the transistors 22, 24 and the point 64 increases, as described hereinabove. The increase in voltage at the point 64 causes the collector current of the transistor 70 to decrease, thereby decreasing the current drawn through the video summing line 18. At a prescribed input signal level, the transistor 70 collector current is cut off, and the video output of the stage limits. In addition, each differential amplifier stage limits for a given input level. The circuit is designed such that the video transistor 70 in each stage limits at a lower signal level than the differential amplifier limits in the previous stage. The variation in transistor 70 collector current, in combination with similar outputs of the succeeding stages, produces a logarithmic characteristic. The log characteristic can be tailored or trimmed by varying the value of the resistor 78 in each stage.

The RC network 80, 81 coupled between the base and collector of transistor 22 and the RC network 82, 83 coupled between the base and collector of the transistor 24 are utilized to control the gain of the differential amplifier stage. In addition, neutralizing capacitors (not shown) can be coupled between the collector of the transistor 22 and the base of the transistor 24 and between the collector of the transistor 24 and the base of the transistor 22 in order to tailor the frequency response of the amplifier.

The construction of the second stage 12 and all succeeding stages is the same as the construction of the stage 10 and will not be repeated. Elements of the second stage designated by reference numerals 122 through 183 are the same as the elements 22 through 83, respectively. The following is a list of suitable component values for the amplifier shown in FIG. 1 for operation at 10 MHz. These values are included by way of example only.

| Transistors 22, 24, 70 | 2N918 |
| Resistors 32, 34 | 200 ohm |
| Resistors 36, 38, 40, 42, 74 | 1k ohm |
| Resistors 44, 46 | 10k ohm |
| Resistors 60, 62, 48 | 10 ohm |
| Resistor 72 | 20 ohm |
| All capacitors | 0.01 microfarad |
| Phase-shifter 16 | 10 microhenry, |
| Supply voltage $V_{cc}$ | center tap $-12$ volts |

Referring again to FIG. 2, the video summing line 18 is connected to each of the stages 10, 12, 14 and to the filter 20. As the rf input signal increases, the last stage limits first and provides a video signal to the summing line 18. For progressively increasing rf input signals, more stages limit and add to the output video amplitude. In the case of very high speed video signals, LC delay lines can be connected between the video outputs of each stage to compensate for circuit delays through the amplifier stages.

The log rf amplifier, in accordance with the present invention, provides superior performance in several respects. The log accuracy is extremely high. For a two-stage amplifier, as shown in FIG. 1, the deviation from a straight line log response was ±0.15 db. In addition, the video pulse response is extremely good and provides a rise time equal to one-half cycle of the rf signal. Furthermore, due to full-wave rectification, the ripple on the video signal is at twice the rf frequency and can be more easily filtered. Finally, the use of differential amplifiers provides very clean limiting and extended bandwidth.

While there has been shown and described what is at present considered the preferred embodiments of the invention, it will be obvious to those skilled in the art that various changes and modifications may be made therein without departing from the scope of the invention as defined by the appended claims.

I claim:

1. A logarithmic rf amplifier comprising:
   means for receiving a first rf signal;
   means for generating a second rf signal from said first rf signal, said second rf signal being said first rf signal shifted in phase by 180°;
   a first amplifier stage comprising
      means, coupled to said means for receiving and to said means for generating, for deriving a first output signal, a second output signal and a third signal from said first rf signal and said second rf signal, said first output signal being an amplified representative of said first rf signal, said second output signal being an amplified representative of said second rf signal and said third signal being a full wave rectification of said first rf signal, and
      means, responsive to said third signal, for providing a first video signal representative of said third signal;
   a second amplifier stage comprising
      means, responsive to said first output signal and said second output signal, for providing a fourth signal, said fourth signal being a full wave rectification of said first output signal, and
      means, responsive to said fourth signal, for providing a second video signal representative of said fourth signal; and
   means for summing said first video signal and said second video signal.

2. A logarithmic rf amplifier as defined in claim 1 wherein said means for deriving comprises:
   a first transistor having an emitter, a base and a collector; and
   a second transistor having an emitter, a base and a collector said base of said first transistor being coupled to said means for receiving said first rf signal, said base of said second transistor being coupled to said means for generating said second rf signal, said emitter of said first transistor and said emitter of said second transitor being coupled to a common node coupled to said means for providing a first video signal, said collector of said first transistor being coupled to a first input lead of said means for providing of said second amplifier stage, and said collector of said second transistor being coupled to a second input lead of said means for providing of said second amplifier stage.

3. A logarithmic amplifier as defined in claim 2 further comprising a first degeneration resistor coupled between said emitter of said first transistor and said common node and a second degeneration resistor coupled between said emitter of said second transistor and said common node.

4. A logarithmic amplifier as in claim 2 wherein said means for providing a first video signal comprises a third transistor having a base, an emitter, and a collector, said emitter of said third transistor being coupled to said common node, said collector of said third transistor being coupled to said means for summing, said base of said third transistor being coupled to a junction node of a resistive divider, the collector current of said third transistor being variable in response to voltage changes on said common node.

* * * * *